(12) United States Patent
Brau et al.

(10) Patent No.: US 7,692,425 B2
(45) Date of Patent: Apr. 6, 2010

(54) METHOD AND APPARATUS OF MULTI-COIL MR IMAGING WITH HYBRID SPACE CALIBRATION

(75) Inventors: Anja C. S. Brau, Menlo Park, CA (US); Philip James Beatty, Menlo Park, CA (US); Stefan Skare, Palo Alto, CA (US); Roland Bammer, Palo Alto, CA (US)

(73) Assignees: General Electric Company, Schenectady, NY (US); The Board of Trustees of the Leland Stanford Jr. University, Palo Alto, CA (US)

( * ) Notice: Subject to any disclaimer, the term of this patent is extended or adjusted under 35 U.S.C. 154(b) by 0 days.

(21) Appl. No.: 12/363,346

(22) Filed: Jan. 30, 2009

(65) Prior Publication Data

US 2009/0134872 A1 May 28, 2009

Related U.S. Application Data

(63) Continuation of application No. 11/867,186, filed on Oct. 4, 2007, now Pat. No. 7,486,075, which is a continuation of application No. 11/278,039, filed on Mar. 30, 2006, now Pat. No. 7,282,917.

(51) Int. Cl.
*G01V 3/00* (2006.01)
(52) U.S. Cl. ........................... 324/309; 324/307
(58) Field of Classification Search ................ 334/309, 334/307
See application file for complete search history.

(56) References Cited

U.S. PATENT DOCUMENTS

| 6,111,411 | A | 8/2000 | Saranathan et al. |
| 6,341,179 | B1 | 1/2002 | Stoyle et al. |
| 6,618,609 | B2 | 9/2003 | Liu et al. |
| 6,680,610 | B1 | 1/2004 | Kyriakos et al. |
| 6,841,998 | B1 | 1/2005 | Griswold |
| 7,064,547 | B1 | 6/2006 | King et al. |
| 7,282,917 | B1 | 10/2007 | Brau et al. |
| 7,382,127 | B2 * | 6/2008 | Gaddipati et al. ............ 324/309 |
| 7,439,739 | B2 * | 10/2008 | Beatty ......................... 324/309 |

(Continued)

OTHER PUBLICATIONS

Pruessmann et al., "SENSE: Sensitivity Encoding for Fast MRI," MRM 42:952-962, 1999.

(Continued)

*Primary Examiner*—Louis M Arana
(74) *Attorney, Agent, or Firm*—Ziolkowski Patent Solutions Group, SC

(57) ABSTRACT

The present invention provides a system and method for parallel imaging that performs auto-calibrating reconstructions with a 2D (for 2D imaging) or 3D kernel (for 3D imaging) that exploits the computational efficiencies available when operating in certain data "domains" or "spaces". The reconstruction process of multi-coil data is separated into a "training phase" and an "application phase" in which reconstruction weights are applied to acquired data to synthesize (replace) missing data. The choice of data space, i.e., k-space, hybrid space, or image space, in which each step occurs is independently optimized to reduce total reconstruction time for a given imaging application. As such, the invention retains the image quality benefits of using a 2D k-space kernel without the computational burden of applying a 2D k-space convolution kernel.

1 Claim, 4 Drawing Sheets

U.S. PATENT DOCUMENTS

| | | | |
|---|---|---|---|
| 7,619,410 B2* | 11/2009 | Beatty et al. | 324/307 |
| 7,622,924 B2* | 11/2009 | Hwang | 324/309 |
| 2004/0155652 A1 | 8/2004 | Sodickson | |
| 2006/0050981 A1 | 3/2006 | Huang | |
| 2006/0284812 A1 | 12/2006 | Griswold et al. | |

OTHER PUBLICATIONS

Griswold et al., "Generalized Autocalibrating Partially Parallel Acquisitions (GRAPPA)," MRM 47:1202-1210, 2002.

Griswold et al., "Field-of-View Limitations in Parallel Imaging," MRM 52:1118-1126, 2004.

Heidemann et al., "VD-Auto-Smash Imaging," MRM 45:1066-1074, 2001.

Kholmovski et al., "GARSE: Generalized Autocalibrating Reconstruction for Sensitivity Encoding MRI," ISMRM 2005, 2672.

Qu et al., "Optimal Utilization of Acquired k-space Points for GRAPPA Reconstruction," ISMRM 2005, 2667.

Wang et al., "Improved Data Reconstruction Method for GRAPPA," MRM 54:738-742, 2005.

Skare et al., "Spatial Modeling of the GRAPPA Weights," ISMRM 2005, 2422.

Brau et al., "Efficient Computation of Autocalibrating Parallel Imaging Reconstructions," ISMRM 2006.

Wang et al., "Image Domain Based Fast GRAPPA Reconstruction and Relative SNR Degradation Factor," ISMRM 2005, 2428.

Bammer et al., "Improving Image Quality in Fetal MRI Using Autocalibrating Reconstruction for Cartesian (ARC) Sampling," ISMRM 2006.

* cited by examiner

METHOD AND APPARATUS OF MULTI-COIL MR IMAGING WITH HYBRID SPACE CALIBRATION

CROSS REFERENCE TO RELATED APPLICATIONS

The present application is a continuation of and claims priority to U.S. Ser. No. 11/867,186 filed Oct. 4, 2007, which is a continuation of and claims priority to U.S. Pat. No. 7,282,917 filed Mar. 30, 2006, the disclosures of which are incorporated herein by reference.

DISCLOSURE OF PARTIES TO JOINT RESEARCH AGREEMENT

This invention was made with Government support under contract EB002711 awarded by the National Institutes of Health. The Government has certain rights in this invention.

BACKGROUND OF THE INVENTION

The present invention relates generally to magnetic resonance (MR) imaging and, more particularly, to a flexible approach for sampling and reconstructing an image of an imaging volume with multiple receiver coils to accelerate data acquisition.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One technique that has been developed to accelerate MR data acquisition is commonly referred to as "parallel imaging" or "partial parallel imaging". In parallel imaging, multiple receive coils acquire data from a region or volume of interest. Thus, parallel imaging is used to accelerate data acquisition in one or more dimensions by exploiting the spatial dependence of phased array coil sensitivity. Parallel imaging has been shown to be successful in reducing scan time, but also reducing image blurring and geometric distortions. Moreover, parallel imaging can be used to improve spatial or temporal resolution as well as increased volumetric coverage.

There are several types of parallel imaging reconstruction methods that have been developed to generate the final, unaliased image from accelerated data. These methods can generally be divided into two categories based on how they treat the reconstruction problem: 1) SENSE-based techniques (Sensitivity Encoding) estimate coil sensitivity profiles from low-resolution calibration images, which can then be used to unwrap aliased pixels in image space using a direct inversion algorithm; and 2) GRAPPA-based techniques (Generalized Auto-calibrating Partially Parallel Acquisition) calculate reconstruction weights necessary to synthesize unacquired data directly from acquired data in k-space using an algorithm that does not require coil sensitivity estimates. The reconstruction weights for GRAPPA are calculated from a small amount of fully sampled calibration data that is typically embedded within the scan ("auto-calibration"), but can also be acquired before or after the scan. While both SENSE- and GRAPPA-based approaches have been successful, in practice, GRAPPA-based techniques have been shown to be preferred when accurate coil sensitivity estimates cannot be obtained, for example, in reduced FOV applications.

One known GRAPPA technique operates entirely in k-space and uses only one-dimensional (1D) convolution kernels. A single set of 1D convolution kernel weights are determined in k-space and subsequently applied in k-space to reconstruct a full k-space data set for each coil. Each k-space data set is then Fourier transformed into a single image such that there is an image per coil. The coil images are combined, e.g., using sum-of-squares, to create a final image. This concept of reconstructing separate k-space data sets for each component coil is precisely what sets GRAPPA apart from its predecessor, VD-AUTO-SMASH. The combination of component coil magnitude images avoids any inter-coil phase errors and the weight generation on a per coil basis makes GRAPPA no longer require that the sensitivity profiles from the involved coils form spatial harmonics, such as needed for SMASH-based techniques.

In the GRAPPA method, the GRAPPA weights, a.k.a. 1D GRAPPA kernel, are estimated and applied only on neighboring data along the direction of acceleration ($k_y$). This is not ideal for most coil configurations, since the sensitivity profiles vary not only in the phase-encoding direction (direction of acceleration) but also in the frequency-encoding direction, which is orthogonal to the acceleration direction. As such, it has been suggested that the accuracy of GRAPPA-based techniques can be improved by using a two-dimensional (2D) rather than a 1D k-space kernel. Moreover, it is believed that the 2D GRAPPA kernel improves the conditioning of the system matrix and therefore reduces reconstruction noise and residual errors. However, this accuracy comes at the expense of an increase in reconstruction time due to the computationally intensive 2D k-space convolution step.

It would therefore be desirable to have a parallel imaging technique that maintains the advantages of parallel imaging, (e.g., reduced scan time), is sufficiently flexible to account for various coil configurations such that variations in sensitivity profiles are considered, and provides significantly reduced reconstruction times.

BRIEF DESCRIPTION OF THE INVENTION

The present invention provides a system and method for parallel imaging that overcomes the aforementioned drawbacks. The invention includes a parallel imaging technique that performs reconstructions with a 2D convolution kernel that exploits the computational efficiencies available when operating in certain data "domains" or "spaces". Thus, the present invention is not limited to "k-space" such as GRAPPA-based techniques or limited to "image space" such as conventional SENSE-based techniques. In this regard, the invention separates the reconstruction process of multi-coil data into a "training phase" and an "application phase" in which reconstruction weights are applied to acquired data to synthesize (replace) missing data. The choice of data space, i.e., k-space, hybrid space, or image space, in which each step occurs is independently optimized to reduce total reconstruction time for a given imaging application. As such, the invention retains the image quality benefits of using a 2D k-space kernel without the computational burden of applying a 2D k-space convolution kernel.

An MR system comprises a plurality of RF receiver coils includes a computer programmed to determine a scan parameter to be optimized. The computer is further programmed to access a plurality of reduced MR data sets acquired with the plurality of RF receiver coils. The plurality of reduced MR data sets may include both undersampled MR data and fully sampled MR calibration data. During a training phase, the computer is programmed to calculate reconstruction convolution kernel weights from the plurality of MR data sets. During an application phase, the computer is programmed to apply the reconstruction weights to the plurality of reduced MR data sets to form a plurality of complete MR data sets. The computer can automatically determine from which of k-space, hybrid space, or image space that the reconstruction weights are to be determined and automatically determine in which of k-space, hybrid space, or image space to synthesize the plurality of complete MR data sets based on the scan parameter to be optimized.

The invention may be embodied in a computer readable storage medium having a computer program for acquiring and reconstructing MR images acquired from a plurality of RF receiver coils. The computer program represents instructions that when executed by a computer cause the computer to access a plurality of reduced k-space data sets acquired with the plurality of RF receiver coils, with the reduced data sets including both undersampled and fully sampled data. Each k-space data set includes MR data encoded in a phase encoded as well as a frequency encoded direction. The computer is further caused to determine reconstruction kernel weights from the reduced k-space data sets and then Fourier transform the kernel weights along the frequency encode dimension. The computer is further programmed or caused to Fourier transform the reduced k-space data sets in the one dimension as well. The transformed kernel weights are then applied to the transformed k-space data sets to synthesize a complete hybrid space for each RF receiver coil. The computer then reconstructs an image from each hybrid space.

A method of parallel imaging is also disclosed and includes the step of acquiring a reduced k-space data set from each of the plurality of receiver coils, where the k-space data sets may include both imaging lines and calibration data lines. The method continues with the step of determining reconstruction kernel weights from the reduced k-space data sets and transforming, in one dimension, the kernel weights and the k-space data sets to hybrid space. The transformed kernel weights are then applied to the hybrid space data sets to synthesize a plurality of complete hybrid space data sets. A respective image from each of the complete hybrid space data sets is then reconstructed.

A method of MR imaging is disclosed as including the steps of estimating a 2D k-space kernel from reduced k-space data sets acquired from a plurality of RF receiver coils, applying the 2D k-space kernel as a 1D convolution in hybrid space, and reconstructing a plurality of coil images from a plurality of hybrid space data sets synthesized by the 1D convolution.

In another method of MR imaging, a reduced k-space data sets from a plurality of RF coils is transformed into hybrid space. The method further comprises the steps of estimating a 1D kernel in hybrid space by constraining the kernel coefficients to vary smoothly along the frequency encode dimension, applying the 1D hybrid space kernel as either a 1D convolution in hybrid space (applied along the phase encode direction for each spatial coordinate along the frequency encode dimension) or a point-by-point multiplication in image space, and reconstructing a plurality of coil images from a plurality of hybrid space data sets or image space data sets synthesized by the application of the hybrid space kernel.

Therefore, in accordance with one aspect of the invention, an MR system comprises a plurality of RF receiver coils and a computer programmed to determine a scan parameter to be optimized and access a plurality of MR data sets acquired with the plurality of RF receiver coils. The computer is further programmed to determine calibration weights from the plurality of MR data sets, automatically determine from which of k-space, hybrid space, or image space the calibration weights are to be determined, and automatically determine in which of k-space, hybrid space, or image space to supplement the plurality of MR data sets with the calibration weights based on the scan parameter to be optimized.

In accordance with another aspect, the present invention is directed to a computer readable storage medium having a computer program for acquiring and reconstructing MR images from a plurality of RF receiver coils and representing instructions that when executed by a computer cause the computer to obtain calibration k-space data lines from a plurality of k-space data sets acquired with the plurality of RF receiver coils. Each data set includes MR data encoded in a phase encoded and a frequency encoded direction. The computer is further caused to determine calibration weights from the calibration k-space data lines and Fourier Transform the calibration weights in one dimension. The computer then Fourier Transforms the k-space data sets in one dimension and applies the transformed calibration weights to the transformed k-space data sets to synthesize a hybrid space of desired size for each RF receiver coil. The computer is also programmed to reconstruct an image from each hybrid space.

According to another aspect of the invention, a method of parallel imaging is disclosed as including the steps of acquiring a k-space data set from each of a plurality of receiver coils and acquiring a set of k-space calibration data lines from each of a plurality of receiver coils. The method also includes the steps of determining kernel weights from the calibration data lines in k-space and transforming, in one-dimension, the kernel weights and the k-space data sets to hybrid space. The transformed kernel weights are applied to the hybrid space data sets to synthesize a plurality of complete hybrid space data sets whereupon the method continues with reconstructing a respective image from each of the complete hybrid space data sets.

The invention is also embodied in a method of MR imaging that includes the steps of estimating a 2D k-space kernel from k-space data acquired from a plurality of RF receiver coils and applying the 2D k-space kernel as a 1D convolution in hybrid space. The method continues with the step of reconstructing a plurality of coil images from a plurality of hybrid space data sets synthesized by the 1D convolution.

In accordance with another aspect, the invention includes a method of MR imaging comprising the steps of acquiring a plurality of k-space data sets from a plurality of RF receiver coils, acquiring a plurality of calibration k-space data sets from the plurality of RF receiver coils, performing a 1D Fourier Transform along a frequency encode direction to create hybrid space data sets and hybrid space calibration data sets, and estimating coefficients of continuous weight functions that build unique sets of 1D hybrid space kernel weights for each location in the frequency encode direction and constrains the 1D hybrid space kernel weights to vary smoothly. The method further includes the steps of building the continuous weight functions by a set of basis functions suitable for the coil configuration, applying the 1D hybrid space kernel weights to the hybrid space data sets as a 1D convolution in hybrid space, or a point-by-point multiplication in image space, and reconstructing a plurality of coil images from a plurality of hybrid space data sets or image space data sets.

In yet another aspect of the invention, a MR system has a computer programmed to obtain a number of fully sampled calibration k-space data lines from a plurality of 3D MR data sets and determine reconstruction weights from the calibration k-space data lines. The computer is also programmed to perform a 1D Fourier Transform along $k_x$ on the calibration weights to convert the calibration weights to hybrid space and perform a 1D Fourier Transform along $k_x$ on the plurality of MR data sets to convert the MR data sets from k-space to hybrid space. The computer then supplements the plurality of MR data sets in hybrid space with hybrid space calibration weights and performs a 2D Fourier Transform on the supplemented MR data sets to convert each data set to 3D image space.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention is directed to a parallel imaging technique that is applicable to k-space, hybrid space, or image space data. K-space is well-known in the art of MR imaging as a matrix that functions as, or is equivalent to, a "frequency domain" repository for positive and negative spatial frequency values that are encoded as complex numbers, e.g., $a+bi$, $i=sqrt(-1)$. That is, the k-space matrix is generally recognized as the repository for spatial frequency signals acquired during evolution and decay of an MR echo. The k-space matrix is typically filled with frequency encoded data in the $k_x$ direction by a frequency encode gradient and in the $k_y$ direction by a phase encode gradient, and can also include phase encoded data in the $k_z$ direction by a second phase encode gradient. Data acquired from the echo is deposited in the k-space matrix in a row, specifically determined by the frequency and phase encode gradient strengths applied during MR signal evolution. K-space is generally filled one row at a time in a Cartesian manner. After all the k-space has been acquired, the elements of the k-space matrix contain positionally-dependent phase change variations along the $k_x$ (frequency encode) and $k_y$ (phase encode) direction. A 2D inverse Fourier transform decodes the frequency domain information. The 2D Fourier transform is a two step process. First, a row-by-row 1D Fourier transform converts each row of k-space data. After the row-by-row Fourier transform, a column-by-column 1D Fourier transform is performed. Collectively, the pair of 1D Fourier transforms converts the k-space data from the frequency domain (k-space data) to the spatial domain (image space data). An image is then reconstructed from the image matrix illustrating spatial and contrast characteristics of the object imaged.

"Hybrid space" refers to the intermediate matrix that results in the performance of one of the 1D Fourier transforms that comprise the 2D Fourier transform that converts k-space to image space. In other words, in 2D Fourier imaging, one Fourier transform is performed in the frequency encoding direction and another Fourier transform is performed in the phase encoding direction. The matrix after the first 1D Fourier transform is considered a "hybrid space". That is, the data is no longer "untransformed" and therefore not considered k-space; however, the data, as a whole, is not yet in the spatial domain and, thus, not in "image space".

Figure 1:
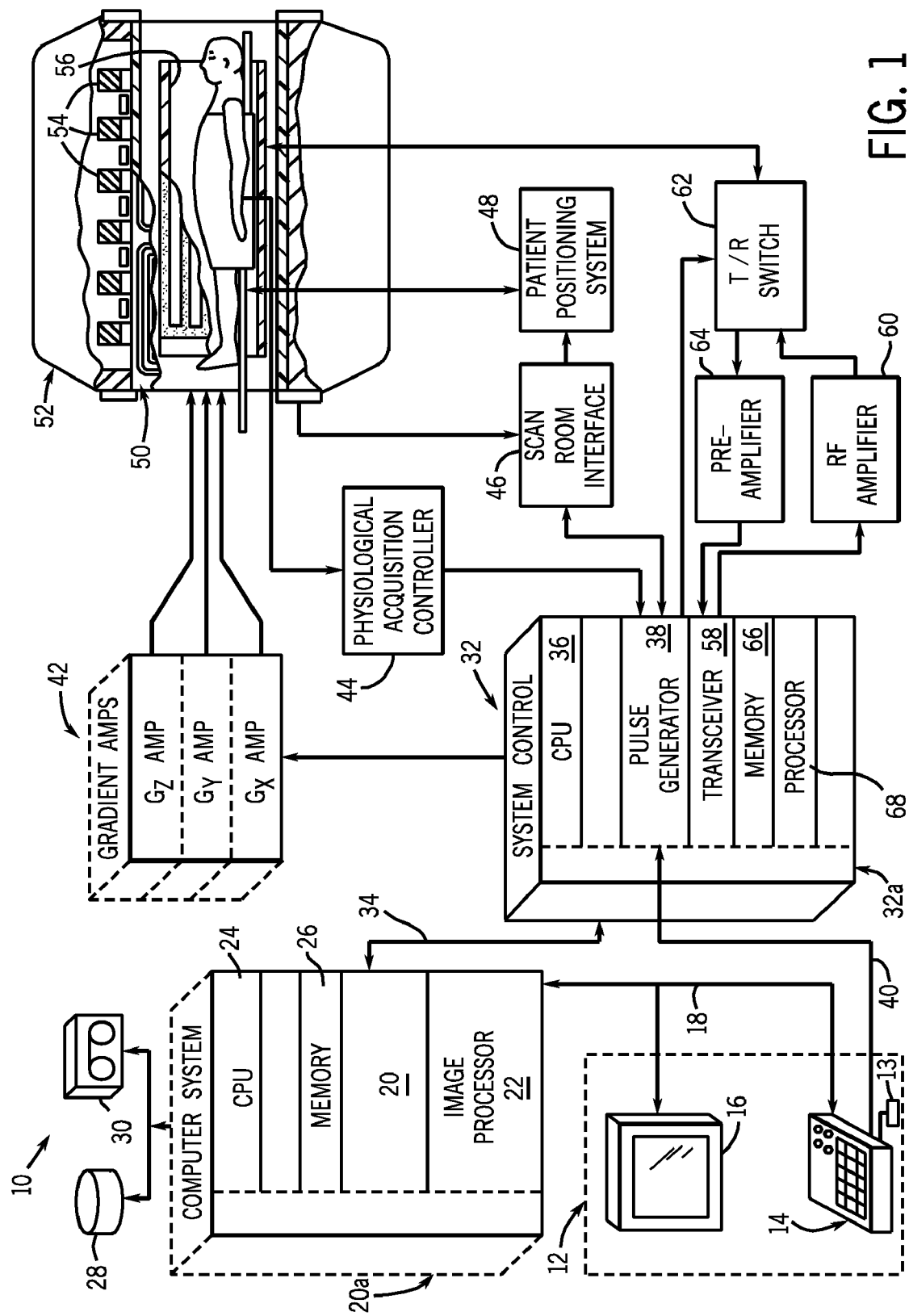
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12, which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules, which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image and each component coil to be reconstructed, and each of these is input to a central processing unit 68 which operates to Fourier transform the data into an array of image data. This image data is conveyed through the ethernet link 34 to the computer system 20 where it is stored in memory, such as disk storage 28. In response to commands received from the operator console 12, this image data may be archived in long term storage, such as on the tape or disk drive 30, or it may be further processed by the image processor 22 and conveyed to the operator console 12 and presented on the display 16.

The MR system described in FIG. 1 may also be equipped with a receive coil array that picks up the MR signals. Such coil arrays are well-known in the art and include whole body arrays as well as partial body arrays, such as head coil arrays, cardiac coil arrays, and spine coil arrays. As will be described, the invention includes a parallel imaging method wherein a region or volume of interest is sampled with an array of RF receive coils. In this regard, the invention is not limited to a particular coil array type or orientation.

Figure 2:
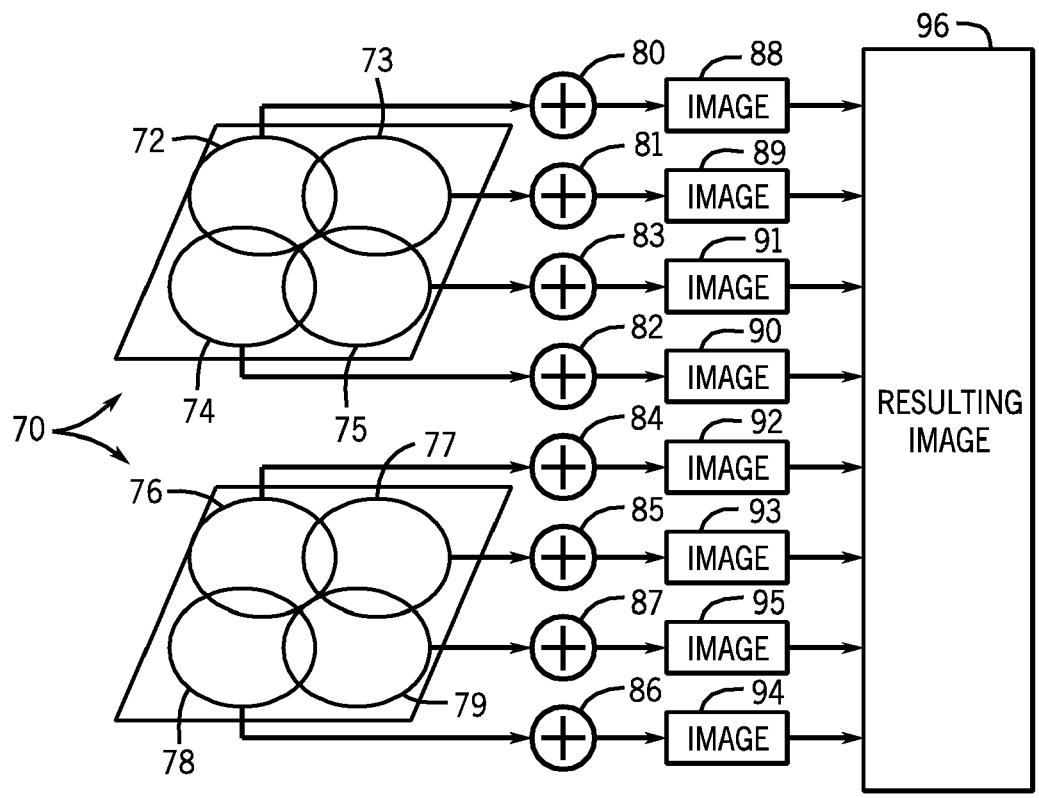
FIG. 2 is a schematic of a coil array usable with the MR imaging system shown in FIG. 1.

Referring now to FIG. 2, a schematic representation of a conventional torso RF coil array 70 is illustrated. The torso RF coil array 70 is a surface coil used to acquire imaging data for a field-of-view (FOV) and includes eight separate coil elements 72-79. Each coil element samples the FOV by detecting changes in excited nuclei in the FOV and transmits signals indicative of that which is detected to separate data acquisition channels 80-87, respectively. The data from each channel is then used to reconstruct a "coil" image 88-95 whereupon the respective coil images are combined into a composite image 96 using one of a number of known summation techniques, e.g., sum of squares. One skilled in the art will appreciate that the coil array illustrated in FIG. 2 is exemplary and that the invention is not limited to parallel acquisition using such a coil array.

As is known in the art of parallel imaging, the sensitivity of each coil element to the FOV can be exploited to accelerate the data acquisition process. The image data of each coil are multiplied by the coil sensitivity inherent to each coil element. The corresponding k-space data are convolved with the Fourier Transform of the spatial coil sensitivity distribution. The spatial coil sensitivity variation imposed by the individual receive coils provides additional spatial encoding functionality complementary to regular gradient encoding that is the basis of all parallel imaging methods. In 2D imaging, that sensitivity is exploited to reduce the number of phase encoding steps in one dimension or direction. In 3D imaging, that sensitivity can be exploited to reduce the number of phase encoding steps in up to two dimensions or directions.

The present invention is directed to a parallel imaging technique that includes a "training phase" and an "application phase", similar to that in GRAPPA-based approaches. However, unlike GRAPPA-based approaches, the present invention is not limited to performing both the training and application phases in the k-space domain. In this regard, the present invention is not limited to any one data space but rather has the flexibility to be performed in k-space, hybrid space, image space, or combinations thereof depending upon the particulars of the MR study. It is preferred that the "training phase" take place in either k-space or hybrid space and that the "application phase" take place in either hybrid space or image space. Doing so still retains the image quality benefits of a 2D k-space kernel. Specifically, as will be set forth below, reconstruction with the present invention can take the form of a 2D convolution in k-space, a 1D convolution in hybrid space, or a point-by-point multiplication in image space.

Figure 3:
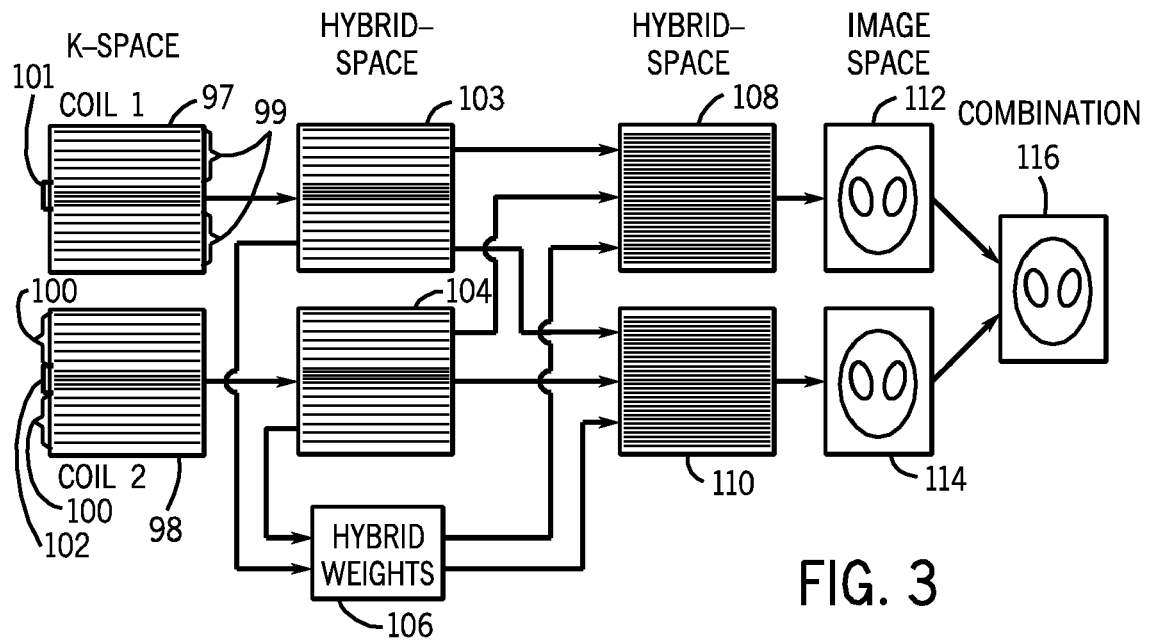
FIG. 3 is a process map illustrating a preferred reconstruction flow in accordance with one aspect of the invention.

In one embodiment of the invention, the training phase and the application phase are performed in the same domain. For example, the entire reconstruction process is performed in hybrid space. The implementation is shown in FIG. 3 for exemplary purposes as being for a coil array comprising two coils. In the illustrated implementation, two separate k-space data sets 97, 98 are acquired. Each k-space data set comprises data sampled from a reduced FOV by a respective coil. Moreover, each k-space data set includes imaging data lines 99, 100 and calibration data lines 101, 102, respectively. As shown, each k-space set is undersampled in the phase encoding direction. That is, a reduced number of phase encoding steps are undertaken so as to reduce scan time. As will be described, the missing phase encoding lines will be synthesized mathematically from the acquired data. Those skilled in art will recognize that the calibration data can also be acquired separately rather than embedded within the scan, so that full acceleration can be accomplished for the parallel imaging scan.

The k-space data sets are Fourier transformed in the one dimension to generate hybrid space data sets 103, 104. Preferably, the 1D Fourier transformations are in the frequency encoding direction. The reconstruction weights 106 are then estimated directly from hybrid space data.

Then, in the application phase, missing data in the hybrid spaces 103, 104, i.e., the undersampled phase encoding locations, is synthesized efficiently from the acquired imaging and calibration data in hybrid space by single matrix-vector multiplication so as to yield complete hybrid spaces 108, 110. In other words, the phase encoding locations that were not sampled are filled from the single matrix-vector multiplication. The hybrid spaces 108, 110 are reconstructed to respective coil images 112, 114, by application of a 1D Fourier transformation in the phase encoding direction. This results in a "coil" image for each coil of the phase coil array. The individual coil images are then combined to yield a single composite image 118 of the FOV.

The reconstruction process illustrated in FIG. 3, as mentioned above, performs the training and application phases in the same domain—the hybrid domain. In this regard, the kernel weights are applied to MR data that is in the spatial domain in the frequency encoding direction and in the k-space domain in the phase encoding direction. In this embodiment, a 1D Fourier transform is performed along the frequency encoding direction to convert the sampled k-space data to hybrid space. The calculation of unique 1D convolution kernel weights at each frequency encoded position in hybrid space, however, can be a heavily under-determined problem that can result in noisy reconstructed images. However, under the assumption that the coil sensitivity varies smoothly in the spatial domain, the weights along the frequency encoding direction can be related to one another with smoothly varying, continuous weight functions represented by a set of basis functions, e.g. a cosine or B-spline basis set. Thus, the reconstruction problem becomes well conditioned. Here, weight functions can be found that reduce fitting errors and lead to improved image quality. The choice of the basis set of functions can vary and may depend on various factors, such as coil configuration. In the training phase, the coefficients of the basis functions that build the weight functions are estimated from the fully sampled calibration data in hybrid space, which amounts to a single matrix inversion problem. Then, in the application phase, missing data is synthesized efficiently from the acquired data in hybrid space by a single matrix-vector multiplication.

Figure 7:
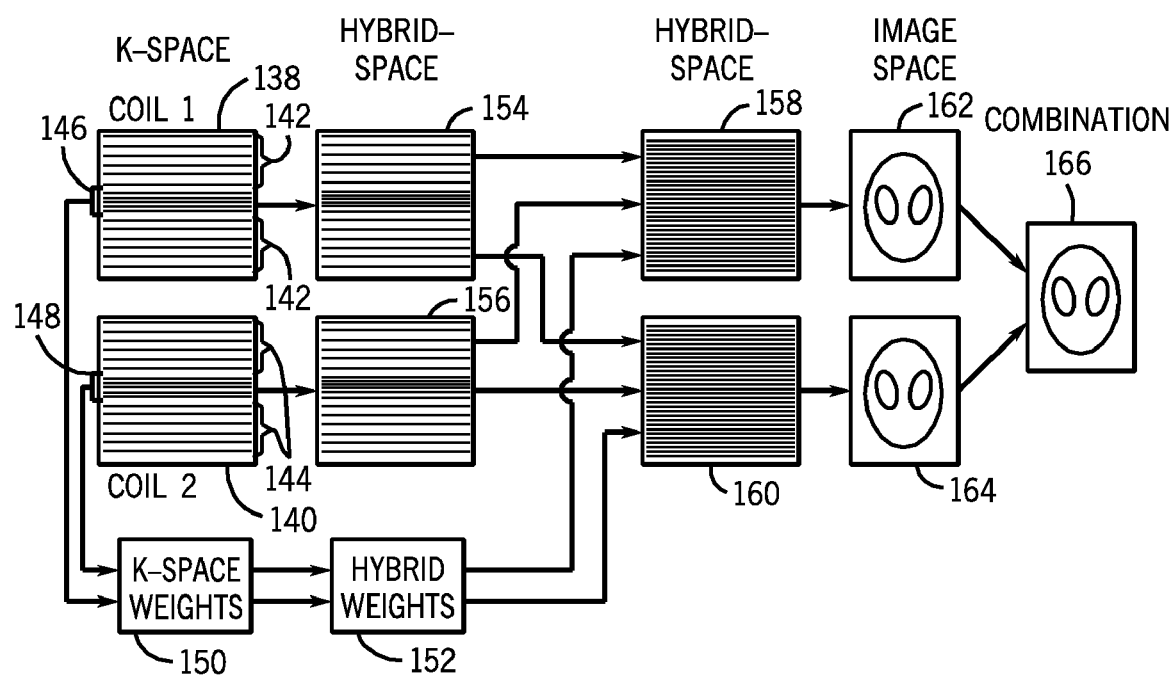
FIG. 7 is a process map illustrating the reconstruction flow in accordance with one aspect of the invention.

In another embodiment, the training phase of the reconstruction process is performed in one domain and the application phase of the reconstruction process is performed in another domain. For example, the 2D k-space kernel weights can be first determined in k-space, then transformed into either hybrid space weights or image space weights to be applied to imaging data that has been similarly transformed into that space. The implementation of determining kernel weights in k-space and transforming them into hybrid space is shown in FIG. 7 for exemplary purposes as being for a coil array comprising two coils.

In the illustrated implementation, two separate k-space data sets 138, 140 are acquired. Each k-space data set comprises data sampled from an FOV by a respective coil. Moreover, each k-space data set includes imaging data lines 142, 144 and calibration data lines 146, 148, respectively. As shown, each k-space set is undersampled in the phase encoding direction. That is, a reduced number of phase encoding steps are undertaken so as to reduce scan time. As will be described, the undersampled phase encoding steps will be accounted for mathematically from the acquired data.

The data embodied in the calibration data lines 146, 148 is used to derive k-space weights 150. Those weights are then Fourier transformed in one dimension to form a set of hybrid weights 152. The k-space data sets are Fourier transformed in the one dimension to generate hybrid space data sets 154, 156. Preferably, the 1D Fourier transformations are in the frequency encoding direction. Then, in the application phase, missing data in the hybrid spaces 154, 156, i.e., the undersampled phase encoding locations, is synthesized efficiently from the acquired imaging and calibration data in hybrid space so as to yield complete hybrid spaces 158, 160. The hybrid spaces 158, 160 are reconstructed to respective coil images 162, 164, by application of a 1D Fourier transformation in the phase encoding direction. This results in a "coil" image for each coil of the phase coil array. The individual coil images are then combined to yield a single composite image 166 of the FOV.

Because calculating the 2D k-space kernel weights can be performed very efficiently in k-space, whereas applying the weights can be performed most efficiently in image space or hybrid space, such a multi-domain approach optimizes net computational efficiency compared to approaches that operate entirely in k-space. This is because the 2D convolution in k-space is replaced by 1D convolutions or multiplications with the transformed kernel in the hybrid or spatial domain, respectively.

It is also contemplated that the training phase and application phases can be performed entirely in image space, although the calculation of weights in image space is not as efficient as in k-space or hybrid space. It should be noted that this image-based approach differs from conventional SENSE-based approaches because unlike SENSE, the present invention does not require sensitivity estimation and; furthermore, performs a fitting algorithm rather than a direct matrix inversion to reconstruct images.

The multi-domain approach of determining weights in k-space and applying them in image space is particularly preferred for time-series acquisitions. In such a study, the calibration data is acquired in only the first acquisition. The determined weights are then applied to the first and subsequent acquisitions. In this regard, the subsequent time-series acquisitions are not burdened by the acquisition of calibration data. The calibration data and reconstruction weights can be reacquired and updated periodically throughout the time series. A drawback to performing the application phase in image space is that it requires a uniform k-space sampling density, a condition that can only be achieved with regularly undersampled data from which the auto-calibration lines have been removed, resulting in reduced SNR and the inability to achieve flexible sampling patterns. Furthermore, the Fourier transformation of the kernel weights from k-space to image space is not negligible. However, in the case of time-series imaging where the auto-calibration data is acquired just once at the beginning of the scan and then used to reconstruct a series of time-resolved images at the same location, performing the application phase in image space becomes computationally efficient.

Figure 4:
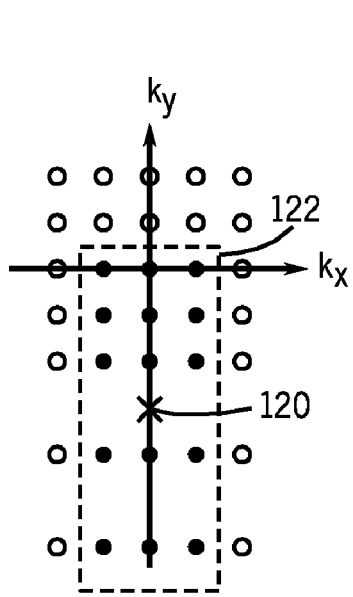
FIG. 4 is a schematic showing that the present invention obtains a more accurate fit when the reconstruction location is near the calibration region.
Figure 5:
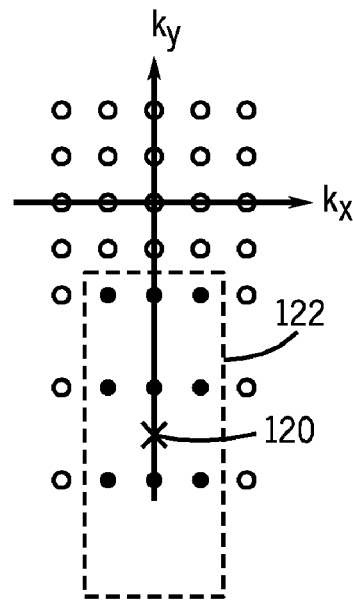
FIG. 5 is a schematic illustrating that the present invention can determine calibration weights from non-zero-padded data.

Performing the application phase in hybrid space retains the flexibility of non-uniform sampling patterns and does not require the removal of auto-calibration lines. Furthermore, it allows tailoring the fitting patterns to the particular sampling pattern to include all available neighboring data, thus improving the accuracy of the fit. This is in contrast to GRAPPA which uses the same kernel weights and fitting pattern to estimate the data for all reconstruction locations. In contrast to GRAPPA, in hybrid space and k-space the present invention varies the fitting pattern to include the acquired data locations in a local neighborhood. As shown in FIG. 4, when the reconstruction location 120 is near the calibration region 122, the present invention takes advantage of the increase in locally acquired data to obtain a more accurate fit. In addition, the present method finds unique weights at the edges of k-space based solely on the acquired data points, as illustrated in FIG. 5. As illustrated in FIG. 5, the weights are preferably found without zero-padding of k-space or hybrid space.

Figure 6:
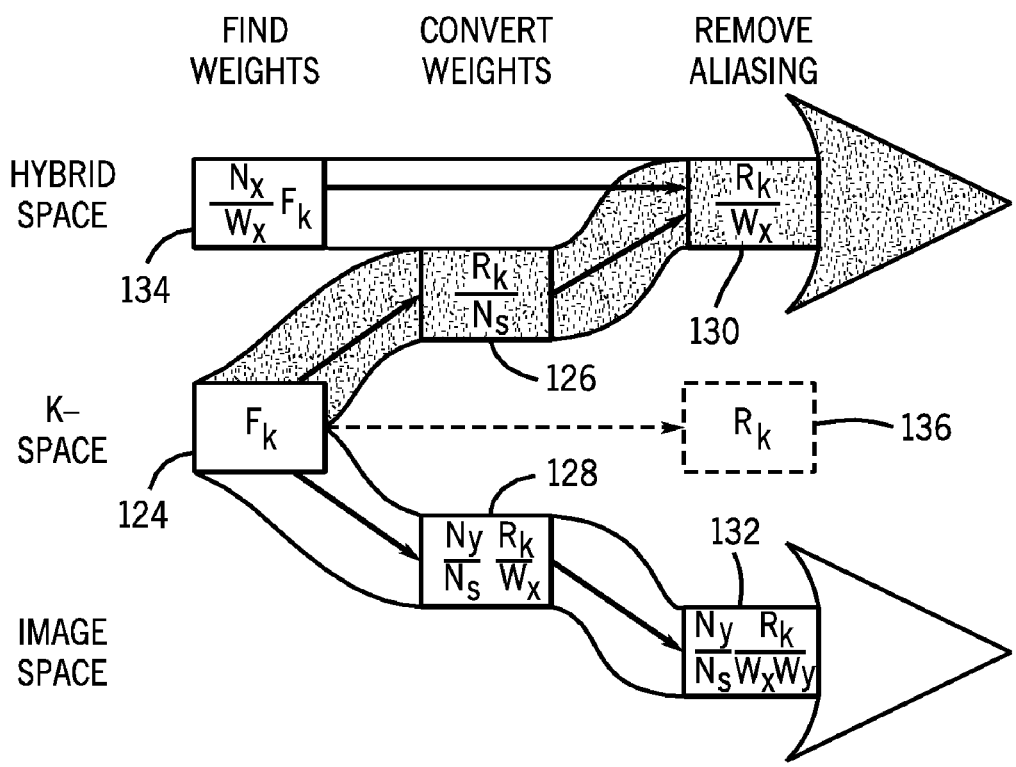
FIG. 6 is a schematic illustrating the variability provided by the present invention.

As referenced above, the present invention is directed to a reconstruction process for parallel imaging that is flexible to account for various scan goals or parameters, such as computation time, coil configuration, etc. As such, the present invention can be summarized by the flow map illustrated in FIG. 6. As shown thereat, kernel weights can be derived in k-space and either 1D Fourier transformed or 2D Fourier transformed to hybrid space weights 126 or image space weights 128, respectively. If the weights are converted to hybrid weights 126, those weights can then be applied in hybrid space to remove aliasing 130. On the other hand, the image space weights are applied in image space to remove aliasing 132. As also shown in FIG. 6, the kernel weights can be determined in hybrid space 134 and applied directly in hybrid space 130 to remove aliasing similar to that described in FIG. 3. Each of the above described paths is preferred from determining and applying the weights in k-space 124, 136. Further, it is believed the most computationally efficient approach for most applications, shown with shading, is to determine the weights from k-space 124, convert those weights to hybrid space 126, and then apply the weights in hybrid space 130, similar to that described in FIG. 7.

The present invention provides an efficient reconstruction of multi-coil MR data with reduced data processing time that is of sufficient flexibility to account for variations in coil sizes, orientations, and other scan parameters. It is believed the advantages of the present invention will be particularly realized as array sizes increase. The invention is also applicable with 1D accelerated (e.g. for 2D imaging) as well as 2D accelerated (e.g. 3D imaging) applications. It is also believed that the present invention provides a cost savings to conventional approaches by reducing hardware requirements. It is further believed that the invention provides an image quality improvement relative to previous k-space domain approaches that did not use all available data to reconstruct missing data.

Accordingly, the invention can advantageously perform the training and application steps of the reconstruction in data domains other than exclusively in k-space. Moreover, the invention offers the flexibility to switch between data domains between reconstruction steps. For example, the training phase can be performed in either k-space or hybrid space and then the application phase can be performed in either hybrid space or image space. The flexibility of the invention allows for the reconstruction to be adapted on a per scan basis as the goals of a scans vary. Moreover, this flexibility allows the reconstruction to take advantage of the benefits available when working in a particular data space at each processing step.

Therefore, an MR system comprises a plurality of RF receiver coils and a computer programmed to determine a scan parameter to be optimized and access a plurality of MR data sets acquired with the plurality of RF receiver coils. The computer is further programmed to determine calibration weights from the plurality of MR data sets, automatically determine from which of k-space, hybrid space, or image space the calibration weights are to be determined, and automatically determine in which of k-space, hybrid space, or image space to supplement the plurality of MR data sets with the calibration weights based on the scan parameter to be optimized.

The present invention is also directed to a computer readable storage medium having a computer program for acquiring and reconstructing MR images from a plurality of RF receiver coils and representing instructions that when executed by a computer cause the computer to obtain calibration k-space data lines from a plurality of k-space data sets acquired with the plurality of RF receiver coils. Each data set includes MR data encoded in a phase encoded and a frequency encoded direction. The computer is further caused to determine calibration weights from the calibration k-space data lines and Fourier Transform the calibration weights in one dimension. The computer then Fourier Transforms the k-space data sets in one dimension and applies the transformed calibration weights to the transformed k-space data sets to synthesize a hybrid space of desired size for each RF receiver coil. The computer is also programmed to reconstruct an image from each hybrid space.

A method of parallel imaging is also disclosed as including the steps of acquiring a k-space data set from each of a plurality of receiver coils and acquiring a set of k-space calibration data lines from each of the plurality of receiver coils. The method also includes the steps of determining kernel weights from the calibration data lines in k-space and transforming, in one-dimension, the kernel weights and the k-space data set to hybrid space. The transformed kernel weights are applied to the hybrid space data sets to synthesize a plurality of complete hybrid space data sets whereupon the method continues with reconstructing a respective image from each of the complete hybrid space data sets.

The invention is also embodied in a method of MR imaging that includes the steps of estimating a 2D k-space kernel from k-space data acquired from a plurality of RF receiver coils and applying the 2D k-space kernel as a 1D convolution in hybrid space. The method continues with the step of reconstructing a plurality of coil images from a plurality of hybrid space data sets synthesized by the 1D convolution.

The invention further includes a method of MR imaging comprising the steps of acquiring a plurality of k-space data sets from a plurality of RF receiver coils, acquiring a plurality of calibration k-space data sets from the plurality of RF receiver coils, performing a 1D Fourier Transform along a frequency encode direction to create hybrid space data sets and hybrid space calibration data sets, and estimating coefficients of continuous weight functions that build unique sets of 1D hybrid space kernel weights for each location in the frequency encode direction and constrains the 1D hybrid space kernel weights to vary smoothly. The method further includes the steps of building the continuous weight functions by a set of basis functions suitable for the coil configuration, applying the 1D hybrid space kernel weights to the hybrid space data sets as a 1D convolution in hybrid space, or a point-by-point multiplication in image space, and reconstructing a plurality of coil images from a plurality of hybrid space data sets or image space data sets.

A MR system is also disclosed as having a computer programmed to obtain a number of fully sampled calibration k-space data lines from a plurality of 3D MR data sets and determine reconstruction weights from the calibration k-space data lines. The computer is also programmed to perform a 1D Fourier Transform along $k_x$ on the calibration weights to convert the calibration weights to hybrid space and perform a 1D Fourier Transform along $k_x$ on the plurality of MR data sets to convert the MR data sets from k-space to hybrid space. The computer then supplements the plurality of MR data sets in hybrid space with hybrid space calibration weights and performs a 2D Fourier Transform on the supplemented MR data sets to convert each data set to 3D image space.

The present invention has been described in terms of the preferred embodiment, and it is recognized that equivalents, alternatives, and modifications, aside from those expressly stated, are possible and within the scope of the appending claims.

What is claimed is:

1. A parallel magnetic resonance (MR) apparatus comprising:
   a plurality of receiver coils, each receiver coil configured to acquire a k-space data set; and
   a control processor programmed to:
   receive a set of k-space calibration data lines from each of the plurality of receiver coils;
   determine a set of kernel weights from the calibration data lines in k-space;
   transform, in one dimension, the set of kernel weights to hybrid space to form hybrid space kernel weights;
   transform, in one dimension, each k-space data set to form a plurality of hybrid space data sets;
   apply the hybrid space kernel weights to the plurality hybrid space data sets to synthesize MR data for each receiver coil;
   for each receiver coil, combine the synthesized MR data with the acquired k-space data set for the receiver coil; and
   reconstruct an image for each receiver coil based on the combination of the synthesized MR data and the acquired k-space data set for the receiver coil.

* * * * *